(12) United States Patent
Hata et al.

(10) Patent No.: US 7,985,529 B2
(45) Date of Patent: Jul. 26, 2011

(54) MASK PATTERNS INCLUDING GEL LAYERS FOR SEMICONDUCTOR DEVICE FABRICATION

(75) Inventors: Mitsuhiro Hata, Gyeonggi-do (KR); Hyun-woo Kim, Gyeonggi-do (KR); Jung-hwan Hah, Gyeonggi-do (KR); Sang-gyun Woo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 25 days.

(21) Appl. No.: 12/496,185

(22) Filed: Jul. 1, 2009

(65) Prior Publication Data
US 2009/0263732 A1    Oct. 22, 2009

Related U.S. Application Data

(63) Continuation of application No. 11/233,406, filed on Sep. 22, 2005, now abandoned.

(30) Foreign Application Priority Data
Sep. 23, 2004   (KR) .................. 10-2004-0076350

(51) Int. Cl.
    *G03F 7/11* (2006.01)
(52) U.S. Cl. .................. 430/272.1; 430/270.1; 430/14
(58) Field of Classification Search .................. 430/14, 430/270.1, 271.1, 272.1, 331
See application file for complete search history.

(56) References Cited

U.S. PATENT DOCUMENTS

| | | | |
|---|---|---|---|
| 5,925,308 A | 7/1999 | Fewkes et al. | |
| 6,555,607 B1 | 4/2003 | Kanda et al. | |
| 6,579,657 B1 * | 6/2003 | Ishibashi et al. | 430/270.1 |
| 6,719,808 B1 | 4/2004 | Kim et al. | |
| 6,818,480 B2 | 11/2004 | Lee et al. | |
| 7,314,691 B2 * | 1/2008 | Hata et al. | 430/14 |
| 7,604,911 B2 * | 10/2009 | Hata et al. | 430/14 |
| 2003/0008965 A1 | 1/2003 | Okamoto et al. | |
| 2003/0157801 A1 | 8/2003 | Kozawa et al. | |
| 2004/0029047 A1 | 2/2004 | Ishibashi et al. | |
| 2004/0234872 A1 | 11/2004 | Horiguchi | |
| 2005/0009365 A1 | 1/2005 | Sugeta et al. | |
| 2005/0095524 A1 * | 5/2005 | Qian et al. | 430/114 |
| 2005/0165152 A1 | 7/2005 | Barr et al. | |
| 2005/0227492 A1 * | 10/2005 | Hah et al. | 438/696 |
| 2005/0251082 A1 * | 11/2005 | Del Bono | 602/41 |
| 2008/0076255 A1 | 3/2008 | Hata et al. | |

FOREIGN PATENT DOCUMENTS

| | | |
|---|---|---|
| JP | 2001-228616 A | 8/2001 |
| JP | 2004-086203 | 3/2004 |
| JP | 2004-145050 A | 5/2004 |
| JP | 2005-301270 | 10/2005 |

OTHER PUBLICATIONS

Iliopoulos et al., "Polymer complexes stabilized through hydrogen bonds. Influence of 'structure defects' on complex formation: Potentiometric study", *European Polymer Journal*, 24(2):171-175 (1988).
Tanaka, "Thermoreversible Gelation Driven by Coil-to Helix Transition of Polymers", *Macromolecules*, 36:5392-5405 (2003).
Japanese Office Action corresponding to Japanese Application No. 2005-276472 mailed Nov. 22, 2010.

* cited by examiner

*Primary Examiner* — Cynthia H Kelly
*Assistant Examiner* — Anca Eoff
(74) *Attorney, Agent, or Firm* — Myers Bigel Sibley & Sajovec, PA

(57) ABSTRACT

Mask patterns include a resist pattern and a gel layer on a surface of the resist pattern having a junction including hydrogen bonds between a proton donor polymer and a proton acceptor polymer. Methods of forming the mask patterns and methods of fabricating a semiconductor device using the mask patterns as etching masks are also provided.

15 Claims, 4 Drawing Sheets

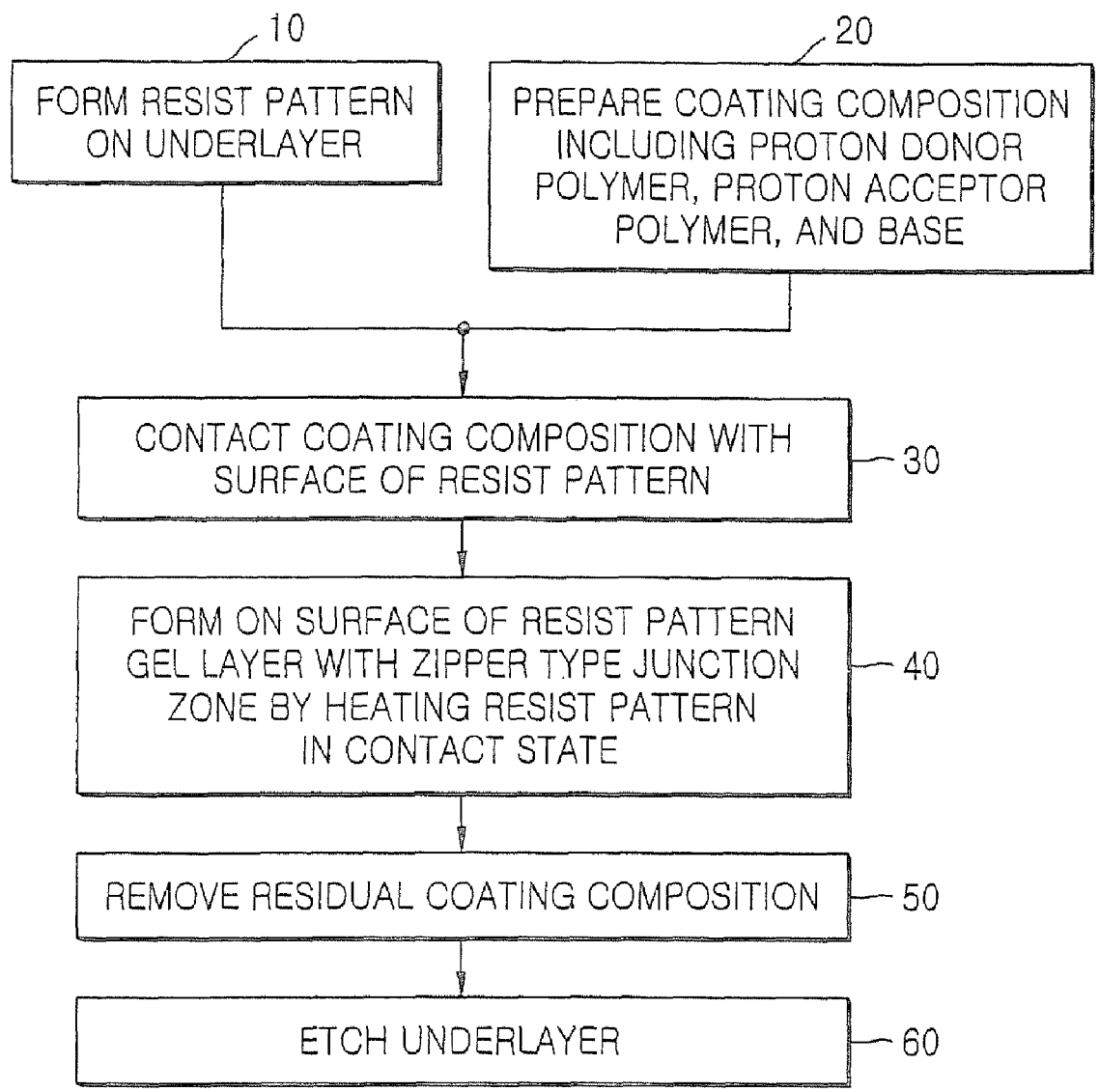

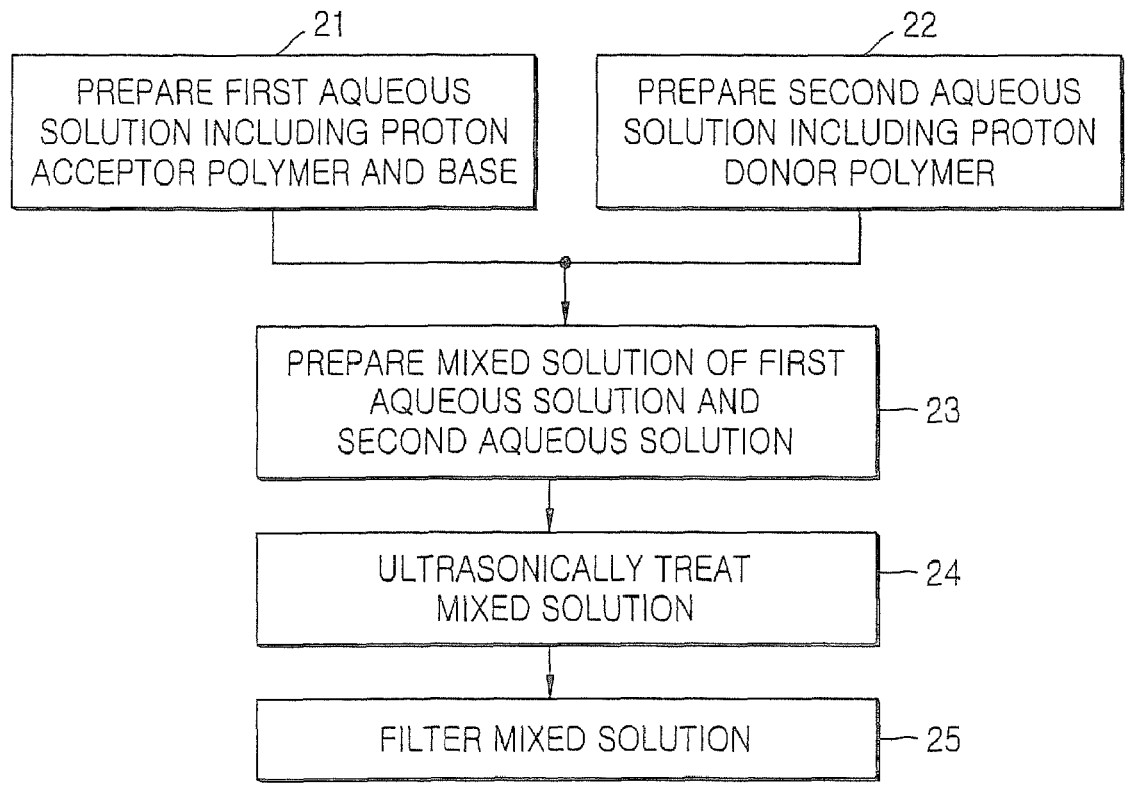
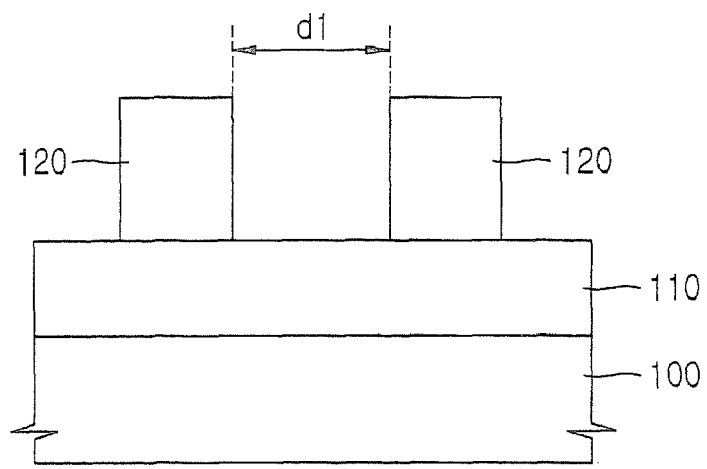

MASK PATTERNS INCLUDING GEL LAYERS FOR SEMICONDUCTOR DEVICE FABRICATION

RELATED APPLICATION DATA

This application is a continuation of U.S. patent application Ser. No. 11/233,406 filed Sep. 22, 2005, now abandoned which claims priority from Korean Patent Application No. 10-2004-0076350, filed Sep. 23, 2004, the disclosure of which are incorporated herein by reference in their entireties.

FIELD OF THE INVENTION

The present invention relates to mask patterns. More particularly, the present invention relates to mask patterns for fabrication of a semiconductor device, methods of forming the same and methods of fabricating a semiconductor device using the mask patterns as etching masks.

BACKGROUND OF THE INVENTION

In a conventional patterning process for semiconductor device fabrication, after a photoresist pattern is formed on a predetermined film to be etched for pattern formation, for example, a silicon film, a dielectric film, or a conductive film, the predetermined film may be etched by using the photoresist pattern as an etching mask to form a desired pattern.

With the increased integration of semiconductor devices, it is desirable to have a design rule of smaller critical dimension (CD) as well as lithography technology suitable for forming fine patterns including contact holes having a smaller opening size or spaces with a smaller width.

In a conventional lithography process for forming smaller-sized contact holes, short-wavelength exposure techniques such as E-beam lithography or a half-tone phase shift mask may be used. Short-wavelength exposure based lithography may present difficulties in that this process can be material-dependent and uneconomical. In particular, half-tone phase shift mask based lithography may pose limitations on mask formation technology and resolution, and thus, it may be difficult to form contact holes which are less than 150 nm in size.

Thus, various techniques for achieving smaller feature sizes have been suggested. For example, Japanese Patent Laid-Open Publication No. 1989-307228 discusses a technique for forming a fine resist pattern in which a resist pattern formed by exposure and development of a resist film is thermally treated so that the profile shape of the resist pattern is altered.

Japanese Patent Laid-Open Publication Nos. 1993-241348, 1994-250379, 1998-73927, 1999-204399, 1999-283905, 1999-283910, 2000-58506, 2000-298356, 2001-66782, 2001-228616, 2001-19860, and 2001-109165 discuss a method of forming a fine resist pattern by a chemical treatment process. In particular, Japanese Patent Laid-Open Publication No. 2001-228616 discusses a technique for decreasing a hole diameter and an isolation width of a resist pattern by increasing the thickness of the resist pattern. According to this technique, the resist pattern that can serve as an acid donor is coated with a framing material that is capable of being crosslinked with the acid. Further, when the acid is transferred from the resist pattern to a layer including the framing material by heating, a crosslinked layer is formed as a layer covering the resist pattern at an interface between the resist pattern and the framing material layer.

Japanese Patent Laid-Open Publication Nos. 2003-107752, 2003-84448, 2003-84459, 2003-84460, 2003-142381, 2003-195527, 2003-202679, 2003-303757, and 2003-316026 discuss a composition for fine pattern formation and a pattern formation method. In particular, Japanese Patent Laid-Open Publication No. 2003-202679 discusses a method of forming fine patterns using a coating agent. The coating agent is coated on a substrate having photoresist patterns in order to decrease spacing between the photoresist patterns caused, at least in part, by the thermal shrinkage effect of the coating agent.

SUMMARY OF THE INVENTION

According to some embodiments of the invention, the mask pattern includes a resist pattern, and a gel layer formed on a surface of the resist pattern having a junction comprising hydrogen bonds between a proton donor polymer and a proton acceptor polymer. In some embodiments, the junction of the gel layer includes a plurality of regions capable of undergoing hydrogen bonding and wherein the proton donor polymer and the proton acceptor polymer are hydrogen bonded therebetween, and a defect region wherein the proton donor polymer and the proton acceptor polymer are not hydrogen-bonded therebetween so as to form a region lacking hydrogen bonding between the hydrogen-bonded regions. Embodiments of the present invention further provide mask patterns for semiconductor device fabrication, having a construction suitable for forming a fine pattern at wavelengths above the wavelength limit of conventional lithography.

Embodiments of the present invention also provide methods of forming a mask pattern for semiconductor device fabrication. In some embodiments, methods of forming a mask pattern include forming a resist pattern on a substrate; and forming on a surface of the resist pattern, a gel layer having a junction formed by hydrogen bonding between a proton donor polymer and a proton acceptor polymer. In some embodiments, forming the gel layer includes preparing a coating composition comprising the proton donor polymer, the proton acceptor polymer, and/or a base; contacting the coating composition with the surface of the resist pattern; and heating the resist pattern to an extent wherein the coating composition is contacted with the surface of the resist pattern to diffuse an acid of the resist pattern into the coating composition. In some embodiments of the present invention, methods of forming a mask pattern for semiconductor device fabrication enable the formation of a fine pattern with a smaller feature size while minimizing the transformation of the sidewall profile of opening or spaces and can ensure a sufficient resistance to dry etching.

Embodiments of the present invention further provide methods of fabricating a semiconductor device including forming an underlayer on a semiconductor substrate; forming a resist pattern having defined regions through which the underlayer is exposed to a first width; forming on a surface of the resist pattern a gel layer having a junction formed by hydrogen bonding between a proton donor polymer and a proton acceptor polymer; and etching the underlayer using the resist pattern and the gel layer as an etching mask.

BRIEF DESCRIPTION OF THE DRAWINGS

FIG. 1 presents a flowchart that schematically illustrates a method of fabricating a semiconductor device according to some embodiments of the present invention;

FIG. 2 presents a flowchart that schematically illustrates a method for preparing a coating composition for fine pattern formation which may be used in a method of fabricating a semiconductor device according to some embodiments of the present invention; and FIGS. 3A through 3F present cross-sectional views that illustrate a method of fabricating a semiconductor device according to some embodiments of the present invention.

DETAILED DESCRIPTION OF EMBODIMENTS ACCORDING TO THE INVENTION

Figure 3B:
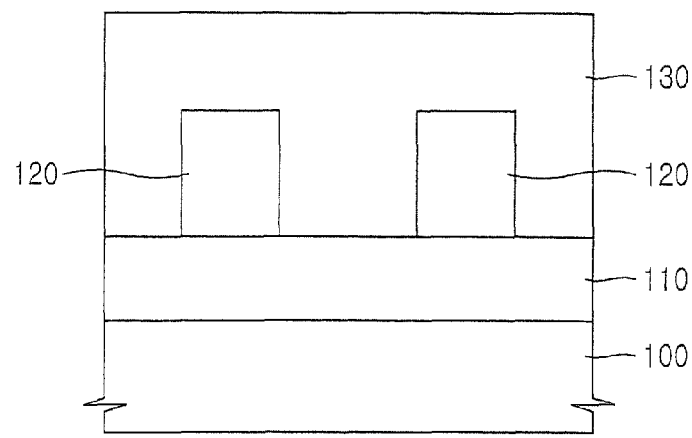

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "up", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature and/or atmospheric pressure or at different temperatures and/or atmospheric pressures without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A method of fabricating a semiconductor device to some embodiments of the present invention will now be described with reference to a flowchart as illustrated in FIG. 1 in blocks 10, 20, 30, 40, 50 and 60. In particular, in a method of forming a resist pattern, an underlayer to be etched is formed on a semiconductor substrate. The underlayer may be formed of any suitable film material. For example, the underlayer may be a dielectric film such as a silicon film, an oxide film, a nitride film, an oxide-nitride film, a conductive film, a semiconductive film and/or a resist film. In some embodiments, in order to form contact holes in the underlayer, the underlayer is formed as a dielectric film. A resist film is formed on the underlayer. In some embodiments, the resist film is subjected to exposure and development by conventional photolithography in order to obtain a resist pattern formed with openings through which the underlayer is exposed to a predetermined width.

Additionally, a coating composition including a proton donor polymer, a proton acceptor polymer, and a base may be prepared. In some embodiments, at least one of these components included in the coating composition, i.e., the proton donor polymer, the proton acceptor polymer, and the base are water-soluble.

Each of the proton donor polymer and the proton acceptor polymer may be used in an amount in a range of about of 0.1 to 5.0 wt %, and in some embodiments about 0.1% to 2.0 wt %, based on the total weight of the coating composition. In the coating composition, the proton donor polymer and the proton acceptor polymer may be mixed at a weight ratio in a range of about of 1:9 to 9:1. The base may be used in an amount in a range of about of 0.1% to 5.0 wt %, and in some embodiments 0.2% to 1.0 wt %, based on the total weight of the coating composition.

In some embodiments, the coating composition may include a surfactant or a thermal acid generator. In some embodiments, the proton donor polymer includes a monomer repeat unit having a —COOH or —COOR group, wherein R may be a substituted or unsubstituted hydrocarbon group of $C_1$ to $C_{20}$.

According to some embodiments of the present invention, the proton donor polymer includes a first repeat unit including at least one compound including an acrylic acid monomer unit represented by a compound of formula 1 and a maleic acid monomer unit represented by a compound of formula 2:

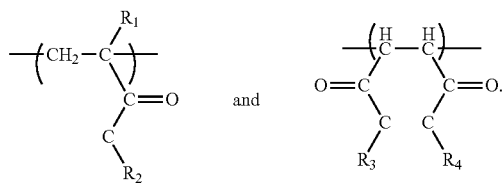

wherein $R_1$ may be hydrogen or a lower alkyl group, such as methyl group, $R_2$, $R_3$, and $R_4$ are each independently hydrogen, a substituted or unsubstituted hydrocarbon group of $C_1$ to $C_{20}$ and/or a substituted or unsubstituted acid-labile group of $C_1$ to $C_{20}$. Examples of substituted or unsubstituted hydrocarbon groups of $C_1$ to $C_{20}$ include methyl and acetyl (isopropyl)(2-methyl-butan-3-on-2-yl). Examples of a suitable acid-labile group include t-butyl, isonorbonyl, 2-methyl-2-adamantyl, 2-ethyl-2-adamantyl, 3-tetrahydrofuranyl, 3-oxocyclohexyl, γ-butyllactone-3-yl, mavaloniclactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-butoxycarbonylmethyl, methoxymethyl, ethoxymethyl, trimethoxysilyl, and/or triethoxysilyl.

In some embodiments, in order to enhance the resistance to dry etching of a mask pattern to be formed according to some embodiments of the present invention, at least one of $R_2$, $R_3$, and $R_4$ of the proton donor polymer may be a group that includes silicon. An exemplary group including silicon to be used herein is a trimethoxysilyl group and/or a triethoxysilyl group.

In some embodiments, the first repeat unit of the proton donor polymer may be a homopolymer including an acrylic acid monomer unit of formula 1 alone or a copolymer including an acrylic acid monomer unit of formula 1 and the maleic acid monomer unit of formula 2.

In some embodiments, the proton donor polymer may further include a second repeat unit $Z_1$ including a monomer unit having a structure that is different from the acrylic acid monomer unit of formula 1 and the maleic acid monomer unit of formula 2. The second repeat unit $Z_1$ may include at least one compound including an acrylamide monomer unit, a vinyl monomer unit, an alkyleneglycol monomer unit, an anhydrous maleic acid monomer unit, an ethyleneimine monomer unit, an oxazoline monomer unit, an acrylonitrile monomer unit, an allylamide monomer unit, a 3,4-dihydropyrane monomer unit, and a 2,3-dihydrofuran monomer unit. The proton donor polymer may be a copolymer, a terpolymer, a tetrapolymer, or the like according to the second repeat unit $Z_1$. Thus, in some embodiments, the second repeat unit $Z_1$ of the proton donor polymer may include two or more different monomer units.

Examples of the acrylamide monomer unit of the second repeat unit $Z_1$ include N,N-dimethylacrylamide, methacrylamide, N,N-dimethylmethacrylamide, N-isopropylacrylamide, aminopropylacrylamide, aminopropylmethacrylamide, N,N-dimethylaminopropylacrylamide, N,N-dimethylaminopropylmethacrylamide, N-acryloylmorpholine, N-methylacrylamide, diacetoneacrylamide, N,N-dimethylaminoethylmethacrylate, N,N-diethylaminoethylmethacrylate, and N,N-dimethylaminoethylacrylate.

Examples of the vinyl monomer unit of the second repeat unit $Z_1$ include vinylalcohol, vinylacetate, vinylacetal, methylvinylether, ethylvinylether, N-vinylpyrrolidone, N-vinylcaprolactam, vinylimidazolidinone, and vinylsulfonic acid.

Examples of the alkyleneglycol monomer unit comprising the second repeat unit $Z_1$ include ethyleneglycol and propyleneglycol.

The second repeat unit $Z_1$ may include a hydrophilic monomer unit alone or in combination of a hydrophobic monomer unit.

According to some embodiments of the present invention, the first repeat unit of the proton donor polymer is present in an amount of about 3% to 90%, and in some embodiments, about 5% to 50%, based on the total number of repeat units. In some embodiments, the proton donor polymer has a weight average molecular weight in a range of about 1,000 to 100,000 daltons, and in some embodiments, about 2,000 to 50,000 daltons.

According to some embodiments of the present invention, the proton acceptor polymer includes a monomer repeat unit including an amido group. In some embodiments, the proton acceptor polymer may include a first repeat unit including a vinyl monomer unit represented by the following formula 3:

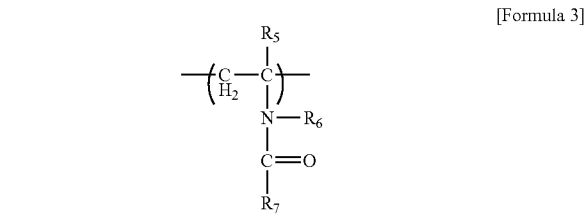

[Formula 3]

wherein $R_5$ may be hydrogen or a lower alkyl group, such as a methyl group, and $R_6$ and $R_7$ are each independently a hydrogen atom or an alkyl group of $C_1$ to $C_5$, $R_6$ and $R_7$ can be connected in the form of —$R_6$-$R_7$.

The proton acceptor polymer may further include a second repeat unit $Z_2$ including a monomer unit including a structure that is different from the vinyl monomer unit of the formula 3.

In some embodiments, the second repeat unit $Z_2$ may include at least one compound including an acrylic monomer unit, a vinyl monomer unit, an alkyleneglycol monomer unit, an ethyleneimine monomer unit, an oxazoline monomer unit, an acrylonitrile monomer unit, an allylamide monomer unit, a 3,4-dihydropyrane monomer unit, and a 2,3-dihydrofuran monomer unit. The proton acceptor polymer may be a copolymer, a terpolymer, a tetrapolymer, or the like according to the second repeat unit $Z_2$. Thus, in some embodiments, the second repeat unit $Z_2$ of the proton acceptor polymer may include two or more different monomer units.

Examples of the acrylic monomer unit of the second repeat unit $Z_2$ include acrylate, methacrylate, maleic acid, anhydrous maleic acid, N,N-dimethylacrylamide, methacrylamide, N,N-dimethylmethacrylamide, N-isopropylacrylamide, aminopropylacrylamide, aminopropylmethacrylamide, N,N-dimethylaminopropylacrylamide, N,N-dimethylaminopropylmethacrylamide, N-acryloylmorpholine, N-methylacrylamide, diacetoneacrylamide, N,N-dimethylaminoethylmethacrylate, N,N-diethylaminoethylmethacrylate, and N,N-dimethylaminoethylacrylate.

Examples of the vinyl monomer unit of the second repeat unit $Z_2$ include vinylalcohol, vinylacetate, vinylacetal, methylvinylether, ethylvinylether, N-vinylpyrrolidone, N-vinylcaprolactam, vinylimidazolidinone, and vinylsulfonic acid.

Examples of the alkyleneglycol monomer unit of the second repeat unit $Z_2$ include ethyleneglycol and propyleneglycol.

The second repeat unit $Z_2$ may include a hydrophilic monomer unit alone or in combination with a hydrophobic monomer unit.

In formula 3, in some embodiments when $R_6$ and $R_7$ are connected in the form of $-R_6-R_7-$, formula 3 may be replaced with a structure represented by formula 4:

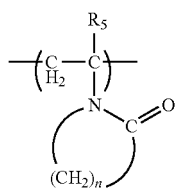

[Formula 4]

wherein n is an integer from 1 to 8. In some embodiments, n is 1, 2, 3, 4, 5, 6, 7 or 8.

A representative example of the proton acceptor polymer including a repeat unit of formula 4 is a polymer including a vinyl pyrrolidone monomer unit or a caprolactam monomer unit.

In some embodiments, the proton acceptor polymer may include a first repeat unit including a vinyl monomer unit represented by the following formula 5:

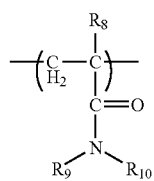

[Formula 5]

wherein $R_8$ is hydrogen or a lower alkyl group, such as methyl group, $R_9$ and $R_{10}$ are each independently a hydrogen atom, or a lower slkyl group, such as a methyl group, an n-propyl group, or an i-propyl group.

The proton acceptor polymer may further include a second repeat unit $Z_3$ to be copolymerized with the vinyl monomer unit of formula 5.

The above description of the second repeat unit $Z_2$ can also be applied to the second repeat unit $Z_3$.

In some embodiments, the first repeat unit of the proton acceptor polymer is present in an amount in a range of about 3% to 100%, and in some embodiments, about 50% to 100%, based on the total number of repeat units. In some embodiments, the proton acceptor polymer has a weight average molecular weight in a range of about 1,000 to 100,000 daltons, and in some embodiments, about 2,000 to 50,000 daltons.

According to some embodiments of the present invention, the base may be used to reduce or prevent formation of a water-insoluble interpolymer complex by formation of a hydrogen bond between the proton donor polymer and the proton acceptor polymer in the coating composition. The base allows the proton donor polymer to include a defect area including a $-COO^-$ group, which may prevent formation of an interpolymer complex between the proton donor polymer and the proton acceptor polymer. Therefore, the coating composition can be maintained as a clear aqueous solution.

In some embodiments, the defect area of the proton donor polymer may also be provided by a protecting group or an acid-labile group which may be present in the proton donor polymer, in addition to the base. That is, a $-COOR$ protecting group (wherein R is a substituted or unsubstituted hydrocarbon group of $C_1$ to $C_{20}$ or a substituted or unsubstituted acid-labile group of $C_1$ to $C_{20}$) which may be present in the proton donor polymer can also constitute the defect area of the proton donor polymer. Therefore, even when the coating composition includes lower amounts of the base, formation of an interpolymer complex between the proton donor polymer and the proton acceptor polymer may be prevented and the coating composition may be maintained as a clear aqueous solution. In some embodiments, the proton donor polymer including a protecting group is used in an amount sufficient to limit, if not exclude, the use of the base.

In some embodiments, the base is used in an amount in a range of about 0.1 to 5.0 wt %, and in some embodiments, about 0.2 to 1.0 wt %, based on the total weight of the coating composition. In some embodiments, the base is a material with a boiling point of at least about 140° C. An exemplary base suitable to be used in the coating composition includes an amine such as monoethanolamine and triethanolamine, tetramethylammonium hydroxide (TMAH), or tetraethylammonium hydroxide.

According to some embodiments of the present invention, the coating composition may further include a trace amount of a protonic acid. In a subsequent thermal treatment for forming a gel layer on a surface of the resist pattern, the protonic acid may serve as a further acid in addition to an acid to be diffused from the resist pattern, thereby facilitating gelation of the coating composition.

In some embodiments, the acid is used in an amount in a range of about 0.1 to 10 wt %, and, in some embodiments, about 0.2 to 1.0 wt %, based on the total weight of the coating composition. The acid may be selected from various materials. The acid may be replaced with a compound generating an acid when subjected to heat. In some embodiments, an exemplary acid suitable to be used in the coating composition is p-toluenesulfonic acid, trifluoroacetic acid, or dodecylbenzenesulfonic acid.

According to some embodiments of the present invention, the surfactant may be used to provide desirable coverage characteristics when the above-described resist pattern is coated with the coating composition. The surfactant may be used in an amount in a range of about 0.01 to 0.5 wt %, based on the total weight of the coating composition. The surfactant may be selected from various materials. In some embodiments, the surfactant may be a commercially available surfactant such as "Zonyl-FSN" (DuPont), "PolyFox™" (OMNOVA Solutions Inc.), "Fluorad™" (3M), "NONIPORU™", (SANYOKASEI), "MEGAFACE™" (Dainippon Ink & Chemicals), or a mixture thereof.

According to some embodiments of the present invention in order to enhance the resistance to dry etching of a mask pattern to be formed according to some embodiments of the present invention, the coating composition may further include an additive such as alcohol, ether, primary amine, secondary amine, tertiary amine, or an organic salt. In some embodiments, the additive may include $R_{11}$—OH, $R_{12}$—O—

$R_{13}$, $N(H)_2R_{14}$, $NHR_{15}R_{16}$, $NR_{17}R_{18}R_{19}$, $(R_{20})_4NSO_3R_{21}$, and $(R_{22})_4NCO_2R_{23}$, wherein $R_{11}$ through $R_{23}$ are each independently a straight-chain alkyl, a branched-chain alkyl, a cyclic alkyl, an aromatic ring, an alkyl substituted aromatic ring, or —$(CH_2)_n$—, wherein n is an integer from 1 to 8, and thus, n may be 1, 2, 3, 4, 5, 6, 7 or 8.

According to some embodiments of the present invention, a solvent used in the coating composition may include deionized water or a mixture of deionized water and an organic solvent. In some embodiments, the solvent is deionized water. When the solvent is a mixture of deionized water and an organic solvent, the organic solvent may be used in an amount in a range of about 0% to 20 wt %, based on the total weight of the coating composition. The organic solvent may include alcohols, nitriles, ketones, esters, lactate esters, aromatic hydrocarbons, and amides.

In some embodiments, the contents of the acid and the base may be adjusted so that the lower critical solution temperature (LCST) of the coating composition is in a range of about 30° to 70°.

According to some embodiments of the present invention, the coating polymer including the proton donor polymer and the proton acceptor polymer may be contacted with a surface of the resist pattern formed as described above. Suitable techniques for this process include spin coating, puddling, dipping, or spraying. In some embodiments, spin coating is employed.

In some embodiments, the time for the contacting step may be set to any time period in a range of about 30 to 90 seconds. In some embodiments, the coating composition may be maintained at a temperature in a range of about 10° to 30° and in some embodiments, at a room temperature. In some embodiments, the contacting step is performed at the same temperature in which the coating composition is maintained.

In contacting the coating composition with the surface of the resist pattern, in some embodiments, the semiconductor substrate may be rotated or fixed according to a contact method. For example, in the case of spin coating, the semiconductor substrate may be rotated about its center at a predetermined speed, for example 500 to 3,000 rpm. In order to perform uniform coating while limiting pattern defects, a rotation speed of 1,500 to 2,000 rpm may be employed. In the case of puddling or spraying, the semiconductor substrate is fixed without moving or rotating.

According to some embodiments of the present invention, the semiconductor substrate may be heated in a state wherein the coating composition is contacted with the surface of the resist pattern to diffuse an acid of the resist pattern into the coating composition. In some embodiments, heating is performed at a temperature in a range of about 120° to 170° for a period of time in a range of about 60 to 90 seconds. As a result of heating, on the surface of the resist pattern, there is formed a gel layer including a zipper type junction zone characterized by hydrogen bonding between the proton donor polymer and the proton acceptor polymer. For a further description of the zipper type junction zone, see *Macromolecules* 2003, 36, pp 5392-5405 and *Eur. Polym. J.* Vol 24, No. 2, pp 171-175, 1988.

In some embodiments, the gel layer is water-insoluble. The zipper type junction zone of the gel layer may include a plurality of hydrogen bond areas in which the proton donor polymer and the proton acceptor polymer may be hydrogen-bonded and a defect area in which the proton donor polymer and the proton acceptor polymer are not hydrogen-bonded therebetween so as to form a loop between the hydrogen bond areas. In the region of the defect, the proton donor polymer has a —$COO^-$ group or a —$COOR$ group wherein R may be a substituted or unsubstituted hydrocarbon group of $C_1$ to $C_{20}$ or a substituted or unsubstituted acid-labile group of $C_1$ to $C_{20}$. R may also be a group including silicon.

According to some embodiments of the present invention, a water-soluble coating composition remaining around the gel layer formed on the surface of the resist pattern may be removed. In some embodiments, the coating composition may be removed by rinsing with deionized water. In particular, rinsing may be performed by rotating the semiconductor substrate at a rate in a range of about 500 to 4,000 rpm for a period of time in a range of about 30 to 90 seconds.

In some embodiments, when the water-soluble coating composition is removed, the water-insoluble gel layer may remain on the surface of the resist pattern. The gel layer may decrease the width of the underlayer exposed through the openings of the resist pattern.

According to some embodiments of the present invention, the underlayer formed on the semiconductor substrate may be etched by using the resist pattern and the gel layer as an etching mask. As a result, a fine pattern above a wavelength limit of lithography may be obtained.

FIG. 2 presents a flowchart that schematically illustrates a method of preparing a coating composition for fine pattern formation according to some embodiments of the present invention as shown in blocks 21, 22, 23, 24 and 25. In some embodiments directed to methods of preparing a coating composition, a first aqueous solution including a proton acceptor polymer and a base is prepared. The first aqueous solution includes a first solvent, in addition to the proton acceptor polymer and the base. The first solvent may be deionized water or a mixture of deionized water and an organic solvent. The first aqueous solution may further include a surfactant and an additive. The base of the first aqueous solution may be limited or excluded according to the type of proton donor polymer used, i.e., as the proton donor polymer has a larger number of protecting groups, the amount of the base can be decreased. The proton acceptor polymer, the base, the surfactant, the additive, and the first solvent are described above.

According to some embodiments of the present invention a second aqueous solution including the proton donor polymer is prepared. The second aqueous solution includes a second solvent, in addition to the proton donor polymer. The second solvent may be deionized water or a mixture of deionized water and an organic solvent. The proton donor polymer and the second solvent are described above.

In some embodiments, a mixed solution of the first aqueous solution and the second aqueous solution may be prepared. More specifically, the second aqueous solution may be added dropwise to the first aqueous solution. In some embodiments, the second aqueous solution may be added dropwise to the first aqueous solution with stirring to prevent the formation of an interpolymer complex in the mixed solution. Addition of the first aqueous solution to the second aqueous solution may produce varying amounts of a sparsely soluble precipitate or hydrogel.

According to some embodiments of the present invention, the mixed solution of the first aqueous solution and the second aqueous solution may be ultrasonically treated in order to disperse trace precipitates or hydrogels that may exist in the mixed solution. In some embodiments, the mixed solution may be filtered to obtain a coating composition as a clear solution. The coating composition thus obtained may have LCST in a range of about 30° C. to 70° C. according to its constitutional components. For example, when the coating composition includes a proton donor polymer, a proton acceptor polymer, and a base, i.e., when an acid is not included in the coating composition, the coating composition may have a low LCST. Therefore, even when the temperature of the coating composition is slightly increased, the coating composition may turn cloudy. As a result, the proton donor polymer and the proton acceptor polymer in the coating composition may interact with each other at a temperature greater than room temperature, thereby forming a water-insoluble interpolymer complex. Accordingly, it is not desirable to maintain the coating composition at a high temperature because it may become difficult to disperse precipitates or hydrogels in the coating composition. In some embodiments, LCST of the coating composition may be controlled by adjusting the contents of the acid or the base in the mixed solution.

FIGS. 3A through 3F present sequential sectional views that illustrate a method of fabricating a semiconductor device according to some embodiments of the present invention. Referring to FIG. 3A, an underlayer 110 to be etched to form a predetermined pattern, for example contact holes or trenches, may be formed on a semiconductor substrate 100. For example, the underlayer 110 may be a dielectric film, a conductive film, a semiconductive film, or a resist film. Next, a resist pattern 120 may be formed on the underlayer 110. The resist pattern 120 may be formed with openings through which an upper surface of the underlayer 110 may be exposed to a first width d1. The resist pattern 120 may be formed with a plurality of openings defining a hole pattern or a plurality of lines defining a line and space pattern. When the resist pattern 120 is formed with a plurality of lines, the first width d1 corresponds to the width of each space between the lines.

In some embodiments, the resist pattern 120 may include a material including a Novolak resin and a diazonaphthoquinone (DNQ)-based compound. The resist pattern 120 may also be formed using a common chemically amplified resist composition including a photo-acid generator (PAG). In some embodiments, the resist pattern 120 may be formed using a resist composition for g-line, a resist composition for i-line, a resist composition for KrF excimer laser (248 nm), a resist composition for ArF excimer laser (193 nm), a resist composition for $F_2$ excimer laser (157 nm), or a resist composition for e-beams. The resist pattern 120 may also be formed using a positive-type resist composition or a negative-type resist composition.

Referring to FIG. 3B, as described above with reference to step 30 of FIG. 1, a coating composition 130 may be contacted with a surface of the resist pattern 120. In some embodiments, the coating composition 130 may be applied on the resist pattern 120 while rotating the semiconductor substrate 100 at a rate in a range of about 500 to 3,000 rpm for a period of time in a range of about 30 to 90 seconds. In some embodiments, the semiconductor substrate 100 may be rotated at a rate in a range of about 1,500 to 2,000 rpm to uniformly coat the coating composition 130 on the semiconductor substrate 100 while causing minimal to no pattern defects.

Figure 3C:
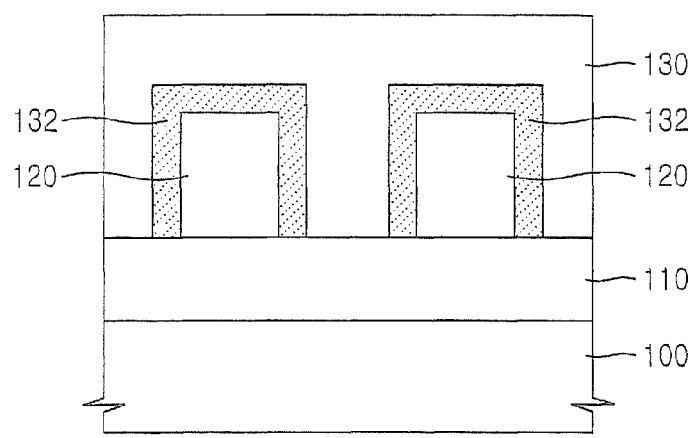

Referring to FIG. 3C, the semiconductor substrate 100 may be heated to a state wherein the coating composition 130 may be contacted with the surface of the resist pattern 120 to diffuse an acid of the resist pattern 120 into the coating composition 130. As a result, a gel layer 132 may be formed on the surface of the resist pattern 120. Heating may be performed at a temperature in a range of about 120° C. to 170° C. The gel layer 132 thus formed may be water-insoluble. The resist pattern 120 and the gel layer 132 may constitute a mask pattern to be used as an etching mask upon etching the underlayer 110.

Figure 3D:
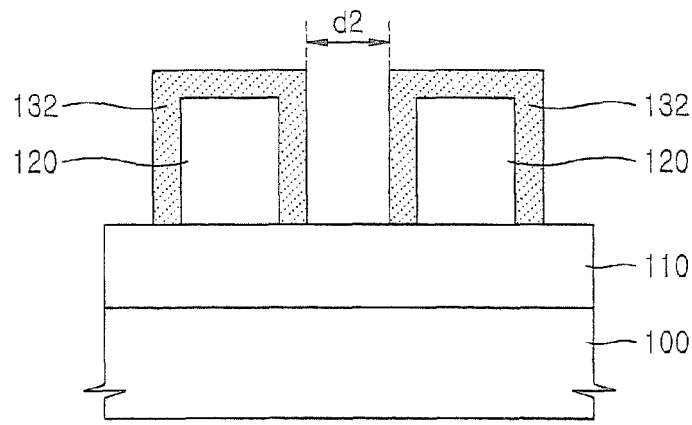

Referring to FIG. 3D, the coating composition 130 remaining around the gel layer 132 may be removed. Since the coating composition 130 may be water-soluble, it may be more readily removed by rinsing with deionized water. As a result, the underlayer 110 may be exposed to a second width d2 which may be smaller than the first width d1 through the openings of the resist pattern 120. Accordingly, an exposed area of the underlayer 110 may be defined by the gel layer 132 formed on the surface of the resist pattern 120.

Figure 3E:
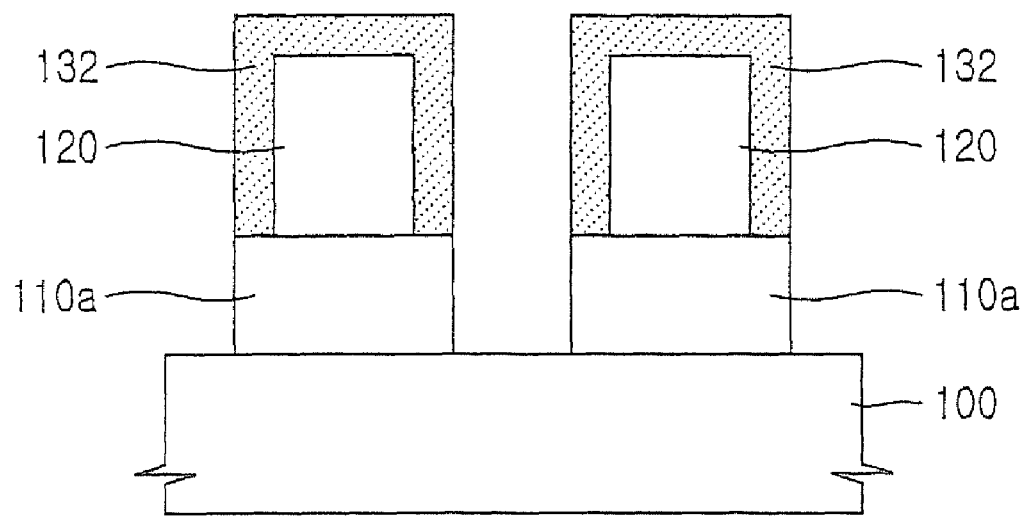

Referring to FIG. 3E, the underlayer 110 may be dry-etched by using the resist pattern 120 and the gel layer 132 as an etching mask to form an underlayer pattern 110a.

Figure 3F:
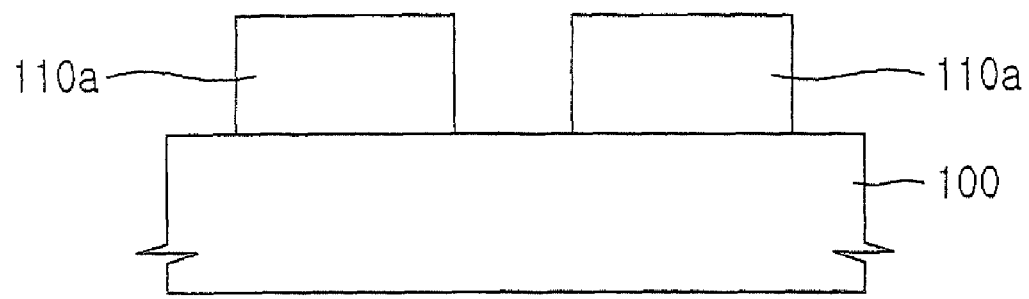

Referring to FIG. 3F, the mask pattern composed of the resist pattern 120 and the gel layer 132 may be removed.

In the methods of fabricating a semiconductor device according to some embodiments of the present invention, the gel layer 132 may be formed on the surface of the resist pattern 120 to reduce the sizes of openings of a mask pattern. The gel layer 132 may be a water-insoluble film that has a zipper type junction zone formed by a hydrogen bond between a proton donor polymer and a proton acceptor polymer. The gel layer 132 formed on the surface of the resist pattern 120 may form a mask pattern with small-sized openings above the wavelength limit of photolithography technology. Furthermore, a vertical sidewall profile of a mask pattern may be maintained unchanged or with minimal change.

Hereinafter, illustrative examples of mask patterns formed according to a mask pattern formation method for semiconductor device fabrication according to some embodiments of the present invention will be described.

More specifically, the present invention will be described in further detail in the following Examples. However, the Examples are provided only for illustrations, and thus, the present invention is not limited thereto.

Example 1

Formation of Resist Pattern

An antireflective film (DUV-30, Nissan Chemical Industries, Ltd.) was formed to a thickness of about 360 Å on an 8-inch bare silicon wafer. A photoresist for ArF (SAIL-G24c, ShinEtsu Chemical Co. Ltd) was subsequently spin-coated on the antireflective film followed by baking at about 105° C. for about 60 seconds to form a resist film with a thickness of about 3,000 Å. The resist film was exposed to light by an ArF(193 nm) stepper followed by post-exposure baking (PEB) at about 105° C. for about 60 seconds. The wafer was developed with a 2.38 wt % tetramethylammonium hydroxide (TMAH) solution to form, on the wafer, a resist pattern having a plurality of openings. The resist pattern had an isolated hole pattern (hereinafter, referred to as "i-hole pattern") with a diameter of 129.7 nm and a dense hole pattern (hereinafter, referred to as "d-hole pattern") with a diameter of 138.0 nm selected at a center portion of a hole array in which a plurality of holes were patterned at a pitch of 240 nm.

Preparation of Partially t-Butyl Protected Poly(Acrylic Acid-Co-Maleic Acid) by Transesterification Poly(acrylic acid-co-maleic acid) (720 mg) and t-butylacetoacetate (4.7 g) were mixed, stirred at 62° C. for 7 hours, and subjected to precipitation with excess hexane. A supernatant was decanted, and the remaining solid was purified with THF (tetrahydrofuran)/hexane and dried under vacuum at 30° C. overnight to provide a partially t-butyl protected poly(acrylic acid-co-maleic acid) (640 mg) as a white powder.

Preparation of Coating Composition

A solution of 22 mg of triethanolamine (TEA) in 1,978 mg $H_2O$ (deionized water), a solution of 2.0 mg of Zonyl FSN in 198 mg $H_2O$, and 1.8 g $H_2O$ were added to a solution of 100 mg of poly(vinylpyrrolidone) in 900 mg $H_2O$ to obtain a first aqueous solution. A second aqueous solution of 100 mg of the partially t-butyl protected poly(acrylic acid-co-maleic acid) obtained as described above in 900 mg $H_2O$ was added dropwise to the first aqueous solution with vigorously stirring. Small quantities of hydrogels created during the dropwise addition were dispersed by ultrasonic treatment. The resultant solution was filtered to give a clean coating composition. The LCST (lower critical solution temperature) of the coating composition was about 45° C. TEA, which was a base used to obtain a clear aqueous solution, was used in an amount of 11 wt %, based on the total amount of a resin used.

Formation of Gel Layer

The coating composition obtained using methods described above was spin-coated on the resist pattern formed according to methods described above to form a uniform film. The uniform film was baked at about 145° C. for about 60 seconds and rinsed with deionized water. As a result, a water-insoluble gel layer was uniformly formed on the surface of the resist pattern. The i-hole pattern and the d-hole pattern had a reduced diameter of 59.1 nm and 115.7 nm, respectively.

Example 2

Control

Preparation of Coating Composition

A solution of 35 mg of TEA in 3,465 mg $H_2O$ a solution of 4.0 mg of Zonyl FSN in 396 mg $H_2O$ and 100 mg $H_2O$ were added to a solution of 100 mg of poly(vinylpyrrolidone) in 900 mg $H_2O$ to obtain a first aqueous solution. A second aqueous solution of 100 mg of an unprotected poly(acrylic acid-co-maleic acid) in 900 mg $H_2O$, unlike in Example 1, was added dropwise to the first aqueous solution with vigorously stirring. The resultant solution was filtered to provide a clean coating composition. The LCST of the coating composition was about 50° C. To obtain a clear aqueous solution, TEA was used in an amount of 17 wt %, based on the total amount of a resin used. Such an increase in the amount of the base used to obtain a clear aqueous solution in this Example, relative to the amount of the base used in Example 1, can be explained by use of the unprotected poly(acrylic acid-co-maleic acid).

Formation of Gel Layer

The coating composition obtained according to methods described above was spin-coated on a resist pattern formed in the same manner as described in Example 1 to form a uniform film. The uniform film was baked at about 145° C. for about 60 seconds and rinsed with deionized water. As a result, a water-insoluble gel layer was uniformly formed on the surface of the resist pattern. The i-hole pattern and the d-hole pattern had a reduced diameter of 73.8 nm and 115.3 nm, respectively.

Example 3

Formation of Resist Pattern

A resist pattern was formed in the same manner as described in Example 1 except that PEB was performed at 115° C. for about 60 seconds. The resist pattern included an i-hole pattern with a diameter of 174.8 nm and a d-hole pattern with a diameter of 134.7 nm.

Preparation of 10% t-Butyl Protected Poly(Acrylic Acid-Co-Maleic Acid) by Esterification Poly(acrylic acid-co-maleic acid) (370 mg), N,N'-dicyclohexylcarbodiimide (10 mg), 4-(dimethylamino)pyridine (3.0 mg), and t-BuOH (2.0 g) were stirred at 23° C. for 4 hours and subjected to precipitation with excess hexane. A supernatant was decanted and the remaining solid was dried under vacuum at 30° C. overnight to provide 10% t-butyl protected poly(acrylic acid-co-maleic acid) (319 mg) as a white solid.

Preparation of Coating Composition

A solution of 5.2 mg of tetramethylammonium hydroxide (TMAH) in 215 mg $H_2O$, a solution of 1.0 mg of Zonyl FSN in 99 mg $H_2O$, and 1.7 g $H_2O$ were added to a solution of 50 mg of poly(vinylpyrrolidone) in 450 mg $H_2O$ to obtain a first aqueous solution. A second aqueous solution of 50 mg of the 10% t-butyl protected poly(acrylic acid-co-maleic acid), obtained as described above, in 450 mg $H_2O$ was added dropwise to the first aqueous solution with vigorous stirring. The resultant solution was filtered to provide a clean coating composition. The amount of TMAH used to obtain a clear aqueous solution was 5.3 wt %, based on the total amount of a resin used.

Formation of Gel Layer

The coating composition obtained in operation 3-3 was spin-coated on the resist pattern formed in operation 3-1 to form a uniform film. The uniform film was baked at about 145° C. for about 60 seconds and rinsed with deionized water. As a result, a water-insoluble gel layer was uniformly formed on the surface of the resist pattern. At this time, the i-hole pattern and the d-hole pattern had a reduced diameter of 160.1 nm and 122.7 nm, respectively.

Example 4

Control

Preparation of Coating Composition

A solution of 40 mg of TMAH in 1,660 mg $H_2O$ a solution of 2.0 mg of Zonyl FSN in 198 mg $H_2O$, and 6.1 g $H_2O$ were added to a solution of 200 mg of poly(vinylpyrrolidone) in 1,800 mg $H_2O$ to obtain a first aqueous solution. A second aqueous solution of 200 mg of an unprotected poly(acrylic acid-co-maleic acid) in 1,800 mg $H_2O$ unlike in Example 3, was added dropwise to the first aqueous solution with vigorous stirring. The resultant solution was filtered to provide a clean coating composition. To obtain a clear aqueous solution, TMAH was used in an amount of 11 wt %, based on the total amount of a resin used. Such an increase of the amount of the base used to obtain a clear aqueous solution in this Example, relative to the amount of the base used in Example 3, can be explained by use of the unprotected poly(acrylic acid-co-maleic acid).

Formation of Gel Layer

The coating composition obtained according to methods described above was spin-coated on a resist pattern formed in the same manner as described in Example 3 to form a uniform film. The uniform film was baked at about 145° C. for about 60 seconds and rinsed with deionized water. As a result, no chemical attachment layers on the surface of the resist pattern were observed.

According to some embodiments of the present invention, a gel layer with a zipper type junction zone formed by a hydrogen bond between a proton donor polymer and a proton acceptor polymer may be formed on the surface of a resist pattern to obtain a mask pattern formed with small-sized openings beyond the wavelength limit of conventional photolithography technology. The mask pattern including the resist pattern and the gel layer formed on the resist pattern may present a vertical sidewall profile. Furthermore, use of a proton donor polymer with a silicon-containing protecting group may increase the silicon content in the mask pattern, thereby enhancing a resistance to dry etching.

While the present invention has been particularly shown and described with reference to some embodiments thereof, it will be understood by those of ordinary skill in the art that various changes in form and details may be made therein without departing from the spirit and scope of the present invention as defined by the following claims.

What is claimed is:

1. A mask pattern comprising:
  a resist pattern; and
  a gel layer on a surface of the resist pattern having a junction comprising hydrogen bonds between a proton donor polymer and a proton acceptor polymer, wherein the junction of the gel layer comprises:
  a plurality of regions capable of undergoing hydrogen bonding, wherein the proton donor polymer and the proton acceptor polymer are hydrogen bonded therebetween; and
  a defect region wherein the proton donor polymer and the proton acceptor polymer are not hydrogen-bonded therebetween so as to form a region lacking hydrogen bonding, between the hydrogen-bonded regions, the defect region of the gel layer forming a loop between the hydrogen bonded regions and the proton donor polymer of the defect region comprises a —COOR group wherein R is a substituted or unsubstituted $C_1$ to $C_{20}$ hydrocarbon comprising silicon or a substituted or unsubstituted $C_1$ to $C_{20}$ acid-labile group comprising silicon, and
  wherein the proton donor polymer comprises a first repeat unit comprising a maleic acid monomer unit according to the following formula:

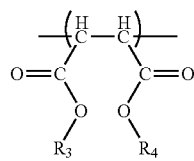

wherein $R_3$ and $R_4$ are each independently hydrogen, a substituted or unsubstituted $C_1$ to $C_{20}$ hydrocarbon or a substituted or unsubstituted $C_1$ to $C_{20}$ acid-labile group.

2. The mask pattern of claim 1, wherein the gel layer is water insoluble.

3. The mask pattern of claim 1, wherein R is methyl, acetyl(isopropyl)(2-methyl-butan-3-on-2-yl), t-butyl, isonorbonyl, 2-methyl-2-adamantyl, 2-ethyl-2-adamantyl, 3-tetrahydrofuranyl, 3-oxocyclohexyl, γ-butyllactone-3-yl, mavaloniclactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-butoxycarbonylmethyl, methoxymethyl, ethoxymethyl, trimethoxysilyl or triethoxysilyl and further comprises silicon.

4. The mask pattern of claim 1, wherein the proton donor polymer further comprises a second repeat unit comprising at least one of an acrylamide monomer unit, a vinyl monomer unit, an alkyleneglycol monomer unit, an anhydrous maleic acid monomer unit, an ethyleneimine monomer unit, an oxazoline group-containing monomer unit, an acrylonitrile monomer unit, an allylamide monomer unit, a 3,4-dihydropyrane monomer unit or a 2,3-dihydrofuran monomer unit.

5. The mask pattern of claim 1, wherein the proton acceptor polymer comprises a first repeat unit comprising a monomer unit having an amido group.

6. The mask pattern of claim 5, wherein the proton acceptor polymer comprises a first repeat unit comprising a vinyl monomer unit according to the following formula:

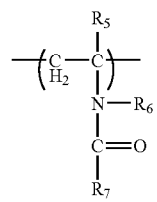

wherein $R_5$ is hydrogen or a methyl group;
  $R_6$ and $R_7$ are each independently hydrogen or $C_1$ to $C_5$ alkyl, and $R_6$ and $R_7$ can be connected in the form of —$R_6$-$R_7$ to form a cyclic structure.

7. The mask pattern of claim 6, wherein the proton acceptor polymer comprises a first repeat unit according to the following formula:

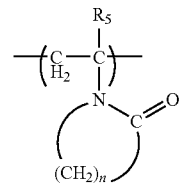

wherein n is an integer of 1 to 5.

8. The mask pattern of claim 7, wherein the proton acceptor polymer comprises a first repeat unit comprising a vinyl pyrrolidone monomer unit.

9. The mask pattern of claim 7, wherein the proton acceptor polymer comprises a first repeat unit comprising a vinyl caprolactam monomer unit.

10. The mask pattern of claim 1, wherein the gel layer further comprises a surfactant.

11. The mask pattern of claim 1, wherein the resist pattern comprises a material comprising a phenol-formaldehyde (Novolac) resin and/or a diazonaphthoquinone (DNQ)-based compound.

12. The mask pattern of claim 1, wherein the resist pattern is formed using a chemically amplified resist composition comprising a photo-acid generator (PAG).

13. The mask pattern of claim 1, wherein the resist pattern is formed using a positive-type resist composition or a negative-type resist composition.

14. The mask pattern of claim 1, wherein the resist pattern is formed with a plurality of openings defining a hole pattern.

15. The mask pattern of claim 1, wherein the resist pattern is formed with a plurality of lines defining a line and space pattern.

* * * * *